United States Patent
Lee et al.

(10) Patent No.: US 6,633,484 B1
(45) Date of Patent: Oct. 14, 2003

(54) HEAT-DISSIPATING DEVICES, SYSTEMS, AND METHODS WITH SMALL FOOTPRINT

(75) Inventors: Seri Lee, Beaverton, OR (US); Lloyd L. Pollard, II, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/716,510

(22) Filed: Nov. 20, 2000

(51) Int. Cl.$^7$ ................................................. H05H 7/20
(52) U.S. Cl. ...................... 361/697; 165/80.3; 165/121; 165/104.33; 165/185; 174/15.2; 361/700; 257/722; 257/715
(58) Field of Search ................................ 165/80.2, 80.3, 165/121–125, 104.33, 185; 174/15.2, 16.3; 257/706–707, 712–715, 721–722; 361/688, 690, 694–695, 697, 699, 700, 704, 707, 710, 719–721; D13/179

(56) References Cited

U.S. PATENT DOCUMENTS

| | | | |
|---|---|---|---|
| 3,182,114 A | * 5/1965 | Burgess et al. | 174/16.3 |
| 3,187,082 A | * 6/1965 | Allison | 174/16.3 |
| 3,239,003 A | 3/1966 | Boudette et al. | 165/185 |
| 4,557,225 A | 12/1985 | Sagues et al. | 128/41.31 |
| 4,688,077 A | 8/1987 | Wakabayashi et al. | 357/81 |
| 4,733,293 A | 3/1988 | Gabuzda | 357/81 |
| 5,132,875 A | 7/1992 | Plesinger | 361/386 |
| 5,374,652 A | 12/1994 | Matsunaga et al. | 165/80.3 |
| 5,437,327 A | 8/1995 | Chiou | 165/122 |
| 5,505,257 A | 4/1996 | Goetz, Jr. | 165/183 |
| 5,567,983 A | 10/1996 | Hirano et al. | 257/722 |
| 5,597,034 A | * 1/1997 | Barker, III et al. | 165/80.3 |
| 5,661,638 A | 8/1997 | Mira | 361/697 |
| 5,704,416 A | 1/1998 | Larson et al. | 165/104.33 |
| 5,761,044 A | 6/1998 | Nakajima | 361/719 |
| 5,777,844 A | 7/1998 | Kiefer | 361/704 |
| 5,785,116 A | 7/1998 | Wagner | 165/80.3 |
| 5,794,685 A | * 8/1998 | Dean | 165/121 |
| 5,920,458 A | 7/1999 | Azar | 361/704 |
| 5,975,194 A | 11/1999 | Wagner | 165/80.3 |
| 6,069,794 A | 5/2000 | Chuang | 361/697 |
| 6,075,702 A | 6/2000 | Gardner et al. | 361/704 |
| 6,152,214 A | 11/2000 | Wagner | 165/121 |
| 6,176,299 B1 | 1/2001 | Hanzlik et al. | 165/80.3 |
| 6,189,601 B1 | 2/2001 | Goodman et al. | 165/80.3 |
| 6,208,511 B1 | 3/2001 | Bortolini et al. | 361/698 |
| 6,219,239 B1 | 4/2001 | Mellberg et al. | 361/704 |
| 6,360,816 B1 | 3/2002 | Wagner | 361/697 |
| 6,411,510 B2 | 6/2002 | Sasa et al. | 361/697 |
| 6,419,007 B1 | 7/2002 | Ogawara et al. | 168/80.3 |
| 2002/0017378 A1 | 2/2002 | Hu | 165/80.3 |

FOREIGN PATENT DOCUMENTS

| | | | |
|---|---|---|---|
| EP | 0856888 | 8/1998 | |
| EP | 0860874 | 8/1998 | |
| EP | 1081760 | 3/2001 | ......... H01L/23/467 |
| JP | 406077677 | 3/1994 | ............ H05K/7/20 |

\* cited by examiner

*Primary Examiner*—Gregory Thompson
(74) *Attorney, Agent, or Firm*—Schwegman, Lundberg, Woessner & Kluth, P.A.

(57) ABSTRACT

An enhanced heat dissipation system and a method to extract heat from an integrated circuit device include a thermally conductive core having upper and lower outer surface areas. The system further includes a first conductive ring having a first array of radially extending fins. The first conductive ring is thermally coupled to the upper outer surface area. The first array and the lower outer surface area of the thermally conductive core are of sufficient size to allow components on a motherboard to encroach around and onto the integrated circuit device when the heat dissipation device is mounted onto the integrated circuit device.

28 Claims, 4 Drawing Sheets

HEAT-DISSIPATING DEVICES, SYSTEMS, AND METHODS WITH SMALL FOOTPRINT

RELATED APPLICATION

The present application is related to the following Continuation-in-Part application that is assigned to the same assignee as the present invention:

Ser. No. 09/766,757, now U.S. Pat. No. 6,535,385, entitled "High Performance Heat Sink Configurations For Use In High Density Packaging Applications".

TECHNICAL FIELD

Embodiments of this invention relate to heat dissipation devices, systems, and methods for an integrated circuit assembly and, more particularly, to devices, systems, and methods for dissipating heat from an integrated circuit device.

BACKGROUND

Integrated circuit devices, microprocessors and other related computer components are becoming more and more powerful with increasing capabilities, resulting in increasing amounts of heat generated from these components. Packaged units and integrated circuit device sizes of these components are decreasing or remaining the same, but the amount of heat energy given off by these components per unit volume, mass, surface area or any other such metric is increasing. In current packaging techniques, heat sinks typically consist of a flat base plate, which is mounted onto the integrated circuit device on one side. The heat sinks further include an array of fins running perpendicular to the flat base plate on the other side. Generally, the integrated circuit devices (which are the heat sources) have a significantly smaller footprint size than the flat base plate of the heat sink. The flat base plate of the heat sink has a large footprint that requires more motherboard real estate than the integrated circuit device in contact therewith. The larger size of the base plate causes the outermost part of the base plate that is not directly in contact with the integrated circuit device to have a significantly lower temperature than the part of the base plate that is directly in contact with the integrated circuit device. Furthermore, as computer-related equipment becomes more powerful, more components are being placed inside the equipment and on the motherboard which further requires more motherboard real estate. In addition, the base plate of prior art heat sink designs is at the same level as the integrated circuit device to which it is attached. Consequently, the flat base plate configuration of the heat sink generally ends up consuming more motherboard real estate than the integrated circuit device on which it is mounted. As a result, the larger footprint size of the base plate prevents other motherboard components, such as low-cost capacitors, from encroaching around or on the microprocessor. Thus, the large amounts of heat produced by many of such integrated circuits, and the increasing demand for motherboard real estate need to be taken into consideration when designing the integrated circuit mounting and packaging devices.

For the reasons stated above, and for other reasons stated below which will become apparent to those skilled in the art upon reading and understanding the present specification, there is a need in the art for enhanced heat dissipation device, systems, and methods that conserve motherboard real estate and allow electronic components to encroach on and around the microprocessor.

DETAILED DESCRIPTION

Figure 1:
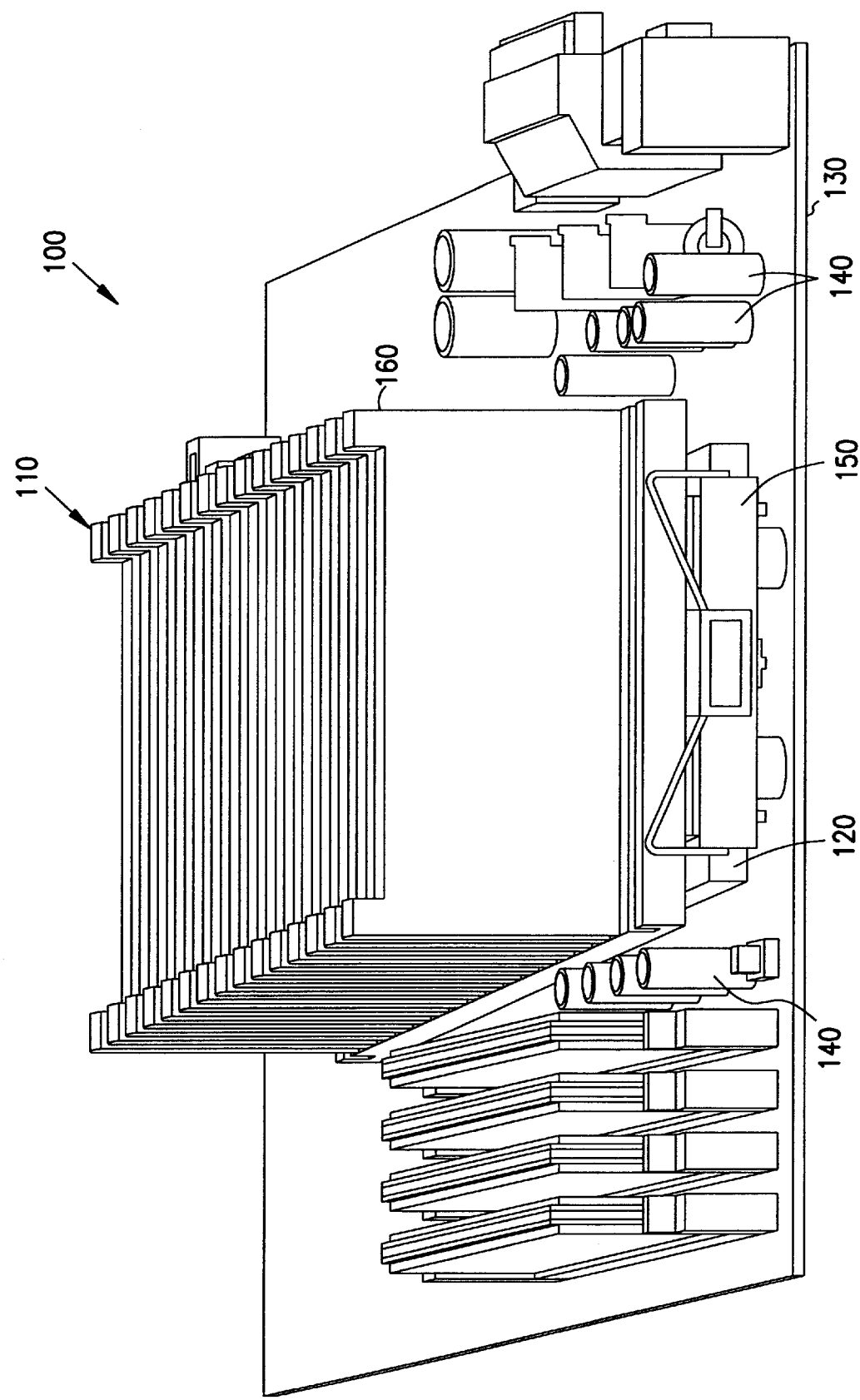
FIG. 1 is an isometric view of a prior art heat sink attached to a microprocessor on an assembled motherboard.

In the following detailed description of the embodiments, reference is made to the accompanying drawings that illustrate the present subject matter and its practice. In the drawings, like numerals describe substantially similar components throughout the several views. These embodiments are described in sufficient detail to enable those skilled in the art to practice the subject matter. Other embodiments may be utilized, and structural, logical, and electrical changes may be made without departing from the scope of the present subject matter. Moreover, it is to be understood that the various embodiments of the subject matter, although different, are not necessarily mutually exclusive. For example, a particular feature, structure, or characteristic described in one embodiment may be included in other embodiments. The following detailed description is, therefore, not to be taken in a limiting sense, and the scope of the present subject matter is defined only by the appended claims, along with the full scope of equivalents to which such claims are entitled.

This document describes, among other things, an enhanced heat dissipation device that allows electronic components to encroach on a microprocessor while maintaining high performance and cost effectiveness by leveraging currently enabled high-volume manufacturing techniques.

FIG. 1 shows an isometric view 100 of a prior art heat sink 110 mounted on a microprocessor 120 of an assembled motherboard 130. Also shown in FIG. 1 are low-cost capacitors 140 mounted around the heat sink 110 and on the motherboard 130.

The prior art heat sink 110 has a flat base plate 150 including an array of fins 160 extending perpendicularly away from the flat base plate 150. This configuration of the heat sink 110 dictates the use of the flat base plate 110, with the array of fins 160 for dissipating heat from the microprocessor 120. Increasing the heat dissipation using the prior art heat sink 110 shown in FIG. 1, generally requires enlarging the surface area of the flat base plate 150 and/or the array of fins 160. This in turn results in consuming more motherboard real estate. Generally, the microprocessor 120 (which is the heat source) has a smaller footprint size than the flat base plate 150 configuration of the heat sink 110 shown in FIG. 1. A larger footprint size of the flat base plate 150 can cause the outermost part of the flat base plate 150 (the portion that is not directly in contact with the integrated circuit device) to have a significantly lower temperature than the part of the flat base plate 150 that is directly in contact with the integrated circuit device. Consequently, the prior art heat sink 110 with the larger flat base plate 150 is not effective in dissipating heat from the integrated circuit device. Furthermore, the packaged units and integrated circuit device sizes are decreasing, while the amount of heat generated by these components is increasing. The prior art heat sink 110 configuration dictates that the array of fins 160 extend to the edge of the flat base plate 150 to extract heat from the integrated circuit device. Also, the prior art heat sink 110 requires increasing the size of the array of fins 160 to increase the heat dissipation. In order to enlarge the fins 160 laterally, the flat base plate 150 has to increase in size. Enlarging the flat base plate 150 consumes more motherboard real estate. Consuming more motherboard real estate is generally not a viable option in an environment where system packaging densities are increasing with each successive, higher performance, integrated circuit device generation. Also, the prior art heat sink 110 is at the same level as the integrated circuit device on which it is mounted. It can be seen in FIG. 1, that the flat base plate 150 configuration of the prior art heat sink 110 mounted on the microprocessor 120 generally prevents other motherboard components, such as low-cost capacitors 140, from encroaching around the microprocessor 120.

Figure 2:
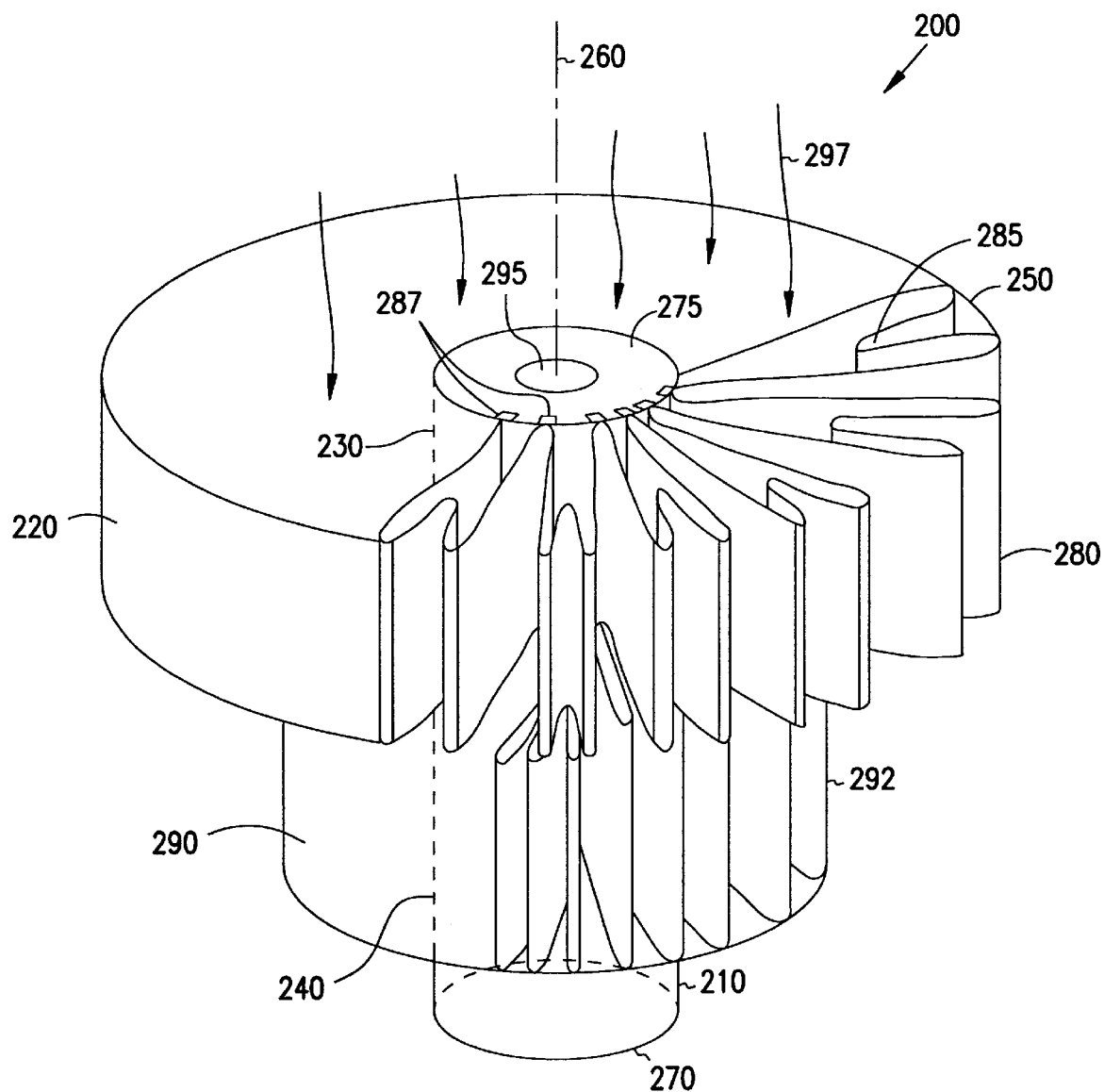
FIG. 2 is an isometric view of an enhanced heat dissipation device according to an embodiment of the present invention.

FIG. 2 is an isometric view of an enhanced heat dissipation device 200 according to an embodiment of the present invention. Shown in FIG. 2 is an enhanced heat dissipation device 200 including a thermally conductive core 210, and a first conductive ring 220. Also shown in FIG. 2 is the thermally conductive core 210 having upper and lower outer surface areas 230 and 240, respectively. The first conductive ring 220 includes a first array of radially extending fins 250. The first conductive ring 220, including the first array of radially extending fins 250 is thermally coupled to the upper outer surface area 230 of the thermally conductive core 210. FIG. 2 further shows an optional second conductive ring 290 thermally coupled to the lower outer surface area 240 of the thermally conductive core 210.

The thermally conductive core 210 has an axis 260. In some embodiments, the upper and lower outer surface areas 230 and 240, respectively, are parallel to the axis 260. The thermally conductive core 210 further has a base 270. In some embodiments, the base 270 is disposed in such a way that it is in close proximity to the lower outer surface area 240 and perpendicular to the axis 260. The upper and lower outer surface areas 230 and 240, respectively, can be concentric to the axis 260.

The first conductive ring 220 is thermally coupled to the upper outer surface area 230 such that components can be mounted around and in close proximity to the lower outer surface area 240 and below the first conductive ring 220 when the heat dissipation device 200 is mounted onto an integrated circuit device. In some embodiments, the components can encroach onto the integrated circuit device without mechanically interfering with the heat dissipation device 200.

The thermally conductive core 210 can be a solid body. The solid body can be cylindrical, conical, square, rectangular, or any other similar shapes that facilitate in mounting onto the integrated circuit device and in attaching the first conductive ring 220 to the upper outer surface area 230. The thermally conductive core 210 can include heat transport mediums such as one or more heat pipes, a liquid, a thermo-siphon, or other such heat transport medium that enhances heat dissipation from the integrated circuit device. The heat dissipation device 200, including the thermally conductive core 210 and the first conductive ring 220, can be made from materials such as aluminum, copper, or any other materials that are capable of dissipating heat away from the integrated circuit device.

The first array of radially extending fins 250 can be made of a first plurality of folded fins. The first plurality of folded fins can also be made of alternating deep and shallow folds 280 and 285, respectively, from a continuous ribbon such that the alternating deep and shallow folds 280 and 285, respectively, wrap around the upper outer surface area 230. The shallow folds have a first depth, and the deep folds have a second depth, and the first depth is less than the second depth. The thermally conductive core 210 can have a plurality of slots 287 parallel to the axis 260 and around the upper outer surface area 230. The first plurality of folded fins can be attached to the plurality of slots 287.

The first conductive ring 220 has a first outer diameter and the second conductive ring 290 has a second outer diameter. The second outer diameter is less than the first outer diameter. The first conductive ring 220 has a first depth and the second outer ring 290 has a second depth. The first and second outer diameters including the first and second depths are of sufficient size to allow components to be mounted around and in close proximity to the integrated circuit device when the heat dissipation device 200 is mounted on the integrated circuit device.

The second conductive ring 290 can have a second array of radially extending fins 292. The second array of radially extending fins are thermally coupled to the lower outer surface area 240 of the thermally conductive core 210. The second array can include a second plurality of folded fins. The second plurality of folded fins can be made from a plurality of alternating deep and shallow folds from a continuous ribbon similar to the first plurality of folded fins shown in FIG. 2.

Figure 3:
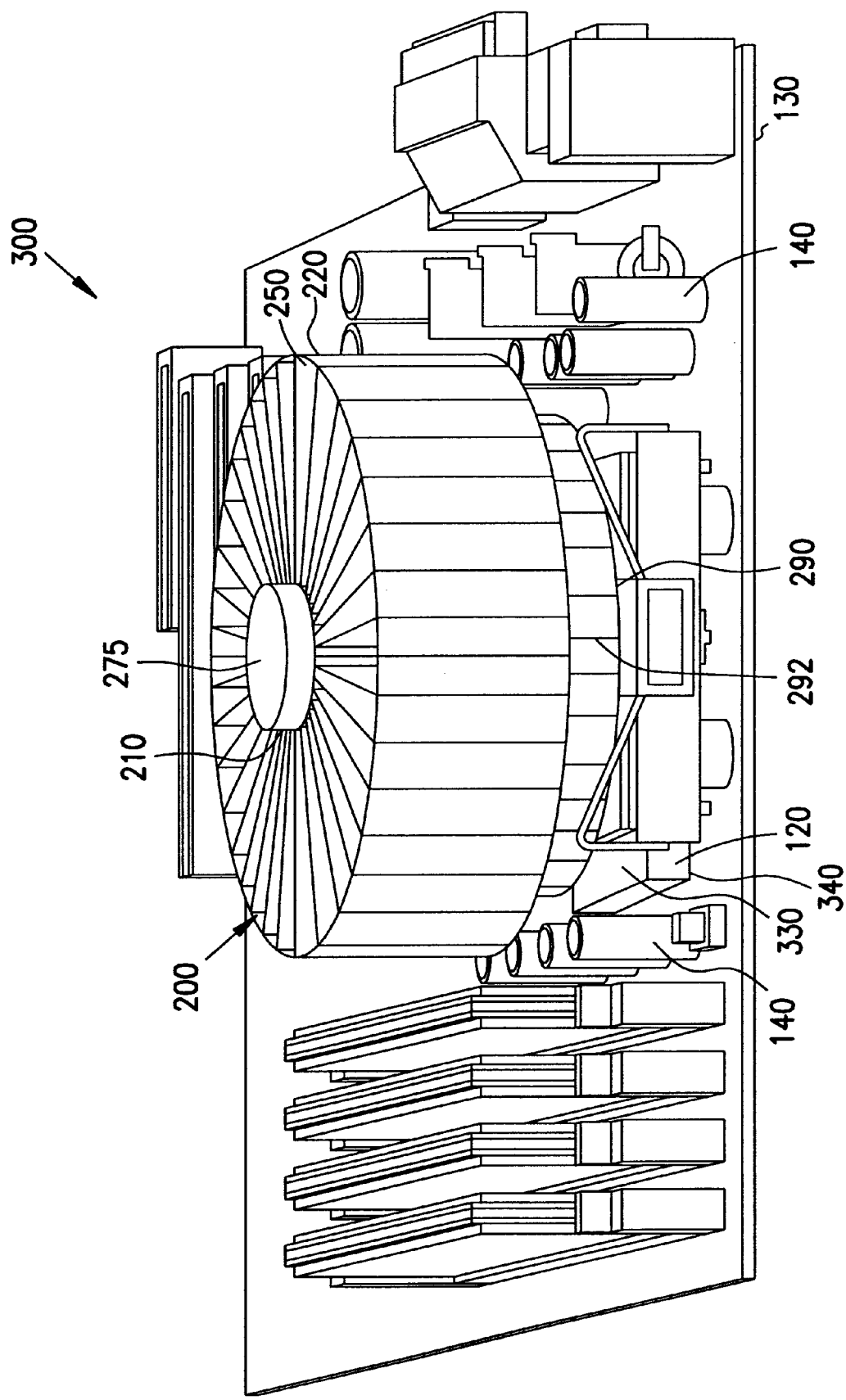
FIG. 3 is an isometric view showing the enhanced heat dissipation device of FIG. 2 attached to a microprocessor on an assembled motherboard.

FIG. 3 is an isometric view 300 showing the enhanced heat dissipation device 200 shown in FIG. 2, attached to the microprocessor 120 on an assembled motherboard 130. In the example embodiment shown in FIG. 3, the microprocessor 120 has a front side 340 and a back side 330. The front side 340 is disposed across from the back side 330. The front side 340 is attached to the assembled motherboard 130 having components such as the low-cost capacitors 140 and other such electrical components. The base 270, shown in FIG. 2, of the enhanced heat dissipation device 200 is attached to the back side 330 of the microprocessor 120. It can be seen from FIG. 3 that the first and second conductive rings 220 and 290, respectively, including the first and second plurality of folded fins 250 and 292, respectively, are of sufficient size so as to allow low-cost capacitors 140 mounted on the assembled board 130 to encroach around the microprocessor 120. It can also be seen the low-cost capacitors 140 are below the first conductive ring 220 and around the second conductive ring 290.

Also, it can be seen in FIG. 3 that the first conductive ring 220 is larger than the second conductive ring 290, thereby increasing the heat dissipation rate without increasing a footprint size of the base 270 (refer to FIG. 2) of the heat dissipation device 200 any more than the back side 330 of the microprocessor 120. The coinciding footprint sizes of the base 270 of the heat dissipation device 200 and the back side 330 of the microprocessor 120 enable the base 270 and the back side 330 of the microprocessor 120 to have same heat transfer rates. This in turn increases the efficiency of heat transfer between the base 270 and the back side 330 of the microprocessor 120.

The thermally conductive core 210 further has a top surface 275 disposed across from the base 270 (refer to FIG. 2). In some embodiments, the top surface 275 is perpendicular to the axis 260 and is in close proximity to the second conductive ring 290. A heat transport medium can be attached to the top surface 275 to introduce a heat transfer medium 297 such as air in a direction shown in FIG. 2, to enhance the heat dissipation by the heat dissipation device 200. Still referring to FIG. 2, a heat transport medium 295 such as a heat pipe, or other such medium can be included in the thermally conductive core 210 to further enhance the heat transfer from the heat dissipation device 200.

Figure 4:
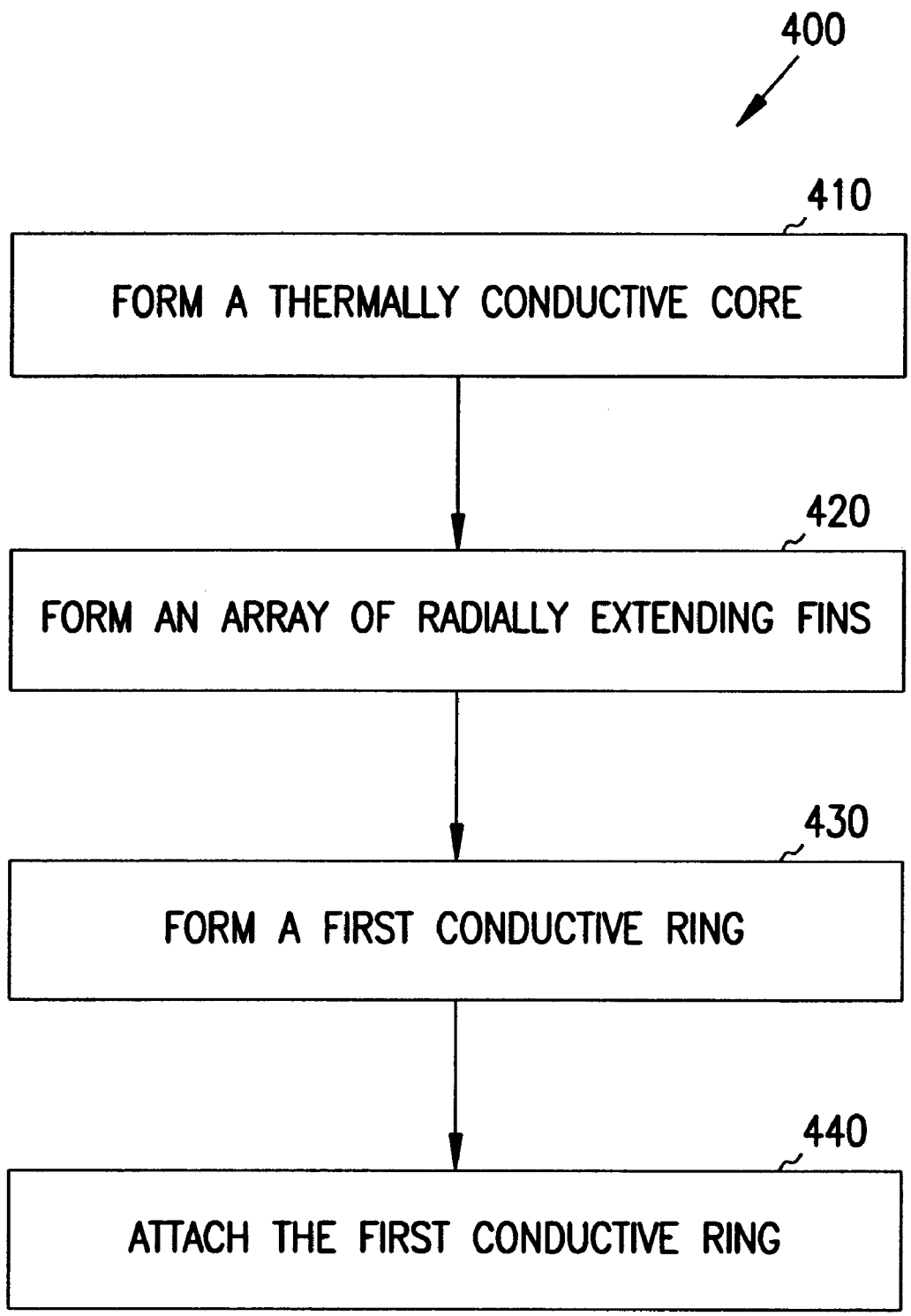
FIG. 4 is a flow diagram of one exemplary method of forming the heat dissipation device of FIG. 2.

FIG. 4 is a flow diagram illustrating generally a method 400 of forming an enhanced heat dissipation device to extract heat from an integrated circuit device mounted on an assembled printed circuit board. Method 400, as shown in FIG. 4, begins with action 410 of forming a thermally conductive core having upper and lower core surface areas. The next action 420 requires forming a first array of radially extending fins. The next action 430 is to form a first conductive ring having a first diameter from the formed first array of radially extending fins. The next action 440 requires attaching the first conductive ring to the upper core surface area such that the lower core surface area has sufficient space below the first conductive ring to allow components to be mounted in close proximity to and around the lower core surface area.

In some embodiments, forming the first array of radially extending fins further includes forming a first conductive ribbon, and forming a first alternative series of deep and shallow folds from the first conductive ribbon, and further forming a first conductive ring from the formed first alternative series of deep and shallow folds.

In some embodiments, the method 400 further includes forming a second array of radially extending fins, and forming a second conductive ring having a second diameter from the formed second array. Further, the second conductive ring is attached to the lower core surface area of the thermally conductive core such that the second diameter is sufficient to allow the components to encroach around the integrated circuit device. In some embodiments, forming the second array of radially extending fins further includes forming a second conductive ribbon, and forming a second alternative series of deep and shallow folds from the second conductive ribbon, and further forming a second conductive ring from the formed second alternative series of deep and shallow folds. The second diameter of the second conductive ring is less than the first diameter of the first conductive ring.

In some embodiments, the enhanced heat dissipation device is made of thermally conductive materials such as copper, aluminum, or any other such material capable of extracting heat away from the integrated circuit device. In some embodiments, the thermally conductive core can include heat transport mediums such as one or more heat pipes, a liquid, a thermo-siphon, or other similar heat transport medium suitable for enhancing the extraction of heat from the integrated circuit device.

CONCLUSION

The above-described devices, systems, and methods provide, among other things, an enhanced heat dissipation using an array of radially extending fins where possible, to allow electronic components to encroach around an integrated circuit device it is mounted on, while maintaining high performance and cost effectiveness by leveraging currently enabled high volume manufacturing techniques

What is claimed is:

1. An enhanced heat dissipation device, comprising:
   a thermally conductive core, wherein the thermally conductive core has a solid body and an axis, and wherein the thermally conductive core has separate upper and lower outer surface areas parallel to the axis; and
   a first conductive ring having a first array of radially extending fins, the first array being thermally coupled to the upper outer surface area of the thermally conductive core, wherein the first conductive ring has a first outer diameter and a first depth, and wherein the first outer diameter and the first depth are of sufficient size to provide sufficient space below the first conductive ring to allow components to be mounted around and in close proximity to the lower outer surface area and below the first conductive ring when the device is mounted on an integrated circuit device.

2. The device of claim 1, wherein the thermally conductive core further has a base, and wherein the base is perpendicular to the axis and in close proximity to the lower outer surface area.

3. The device of claim 1, wherein the upper and lower outer surface areas are concentric to the axis.

4. The device of claim 1, wherein the components can encroach on the integrated circuit device without mechanically interfering with the integrated circuit device.

5. The device of claim 1, wherein the thermally conductive core has an outer shape selected from the group consisting of cylindrical, conical, square, and rectangular.

6. The device of claim 1, wherein the thermally conductive core and the first array of radially extending fins are made from materials selected from the group consisting of aluminum and copper.

7. The device of claim 1, wherein the first array comprises a first plurality of folded fins.

8. An enhanced heat dissipation device comprising:
   a thermally conductive core, wherein the thermally conductive core has upper and lower outer surface areas; and
   a first conductive ring having a first array of radially extending fins, the first array being thermally coupled to the upper outer surface area of the thermally conductive core, the first array including a first plurality of folded fins, and the first plurality of folded fins including a plurality of alternating deep and shallow folds in a continuous ribbon such that the alternating deep and shallow folds wrap around the upper outer surface area.

9. The device of claim 8, wherein the shallow folds have a first depth and the deep folds have a second depth, and wherein the first depth is less than the second depth.

10. The device of claim 8, wherein the thermally conductive core has a plurality of slots parallel to the axis and around the upper outer surface area, and wherein the first plurality of folded fins are attached to the plurality of slots.

11. An enhanced heat dissipation device comprising:
    a thermally conductive core, wherein the thermally conductive core has upper and lower outer surface areas;
    a first conductive ring having a first array of radially extending fins, the first array being thermally coupled to the upper outer surface area of the thermally conductive core; and
    a second conductive ring, thermally coupled to the lower outer surface area, wherein the first conductive ring has a first outer diameter, wherein the second conductive ring has a second outer diameter, and wherein the second outer diameter is less than the first outer diameter.

12. The device of claim 11, wherein the second outer diameter has a size sufficient to allow components to be mounted around and in close proximity to the second conductive ring and below the first conductive ring when the device is mounted on an integrated circuit device.

13. The device of claim 11, wherein the second conductive ring has a second array of radially extending fins, and wherein the second array is coupled to the lower outer surface area of the thermally conductive core.

14. The device of claim 13, wherein the second array comprises a second plurality of folded fins.

15. The device of claim 14, wherein the second plurality of folded fins comprises a plurality of alternating deep and shallow folds in a continuous ribbon around the lower outer surface area.

16. A heat dissipation system comprising:
an integrated circuit device having a front side and a back side, wherein the front side is disposed across from the back side, wherein the front side is attached to a circuit board having components; and
an enhanced heat dissipation device including
a thermally conductive core attached to the back side of the integrated circuit device, the thermally conductive core having upper and lower core surface areas, wherein the upper and lower core surface areas have a first and second length; and
a first conductive ring having a first plurality of folded fins, the first plurality of folded fins being thermally coupled to the upper core surface area, the first plurality of folded fins surrounding the upper core surface area, the first length of the first conductive ring being sufficient to permit components to be mounted on the circuit board and below the first conductive ring.

17. The heat dissipation system of claim 16, wherein the thermally conductive core further comprises a base, wherein the base is in close proximity to the lower core surface area, and wherein the base and the back side of the integrated circuit device have coinciding footprint sizes so that temperatures of the integrated circuit device, the base, the first plurality of folded fins, and the thermally conductive core are close to each other during operation to enhance heat transfer from the integrated circuit device.

18. The heat dissipation system of claim 17, further comprising:
a heat transport medium, wherein the thermally conductive core further has a top surface disposed across from the base and in close proximity to the upper core surface area, and wherein the heat transport medium is attached to the top surface such that a direction of flow of a cooling medium introduced by the heat transport medium over the first plurality of folded fins enhances heat extraction from the integrated circuit device.

19. A heat dissipation system comprising:
an integrated circuit device having a front side and a back side, wherein the front side is disposed across from the back side, and wherein the front side is attached to a circuit board having components;
a heat dissipation device including
a thermally conductive core attached to the back side of the integrated circuit device, the thermally conductive core having upper and lower core surface areas, wherein the upper and lower core surface areas have a first and second length;
a first conductive ring having a first plurality of folded fins, the first plurality of folded fins being thermally coupled to the upper core surface area, the first plurality of folded fins surrounding the upper core surface area, the first length of the first conductive ring being sufficient to permit components to be mounted on the circuit board and below the first conductive ring, wherein the thermally conductive core further comprises a base, wherein the base is in close proximity to the lower core surface area, and wherein the base and the back side of the integrated circuit device have coinciding footprint sizes so that temperatures of the integrated circuit device, the base, the first plurality of folded fins, and the thermally conductive core are close to each other during operation to enhance heat transfer from the integrated circuit device;
a second conductive ring having a second plurality of folded fins, the second plurality of folded fins being thermally coupled to the lower core surface area, the second conductive ring having a second diameter, the first conductive ring having a first diameter, wherein the second diameter is less than the first diameter and is sufficient to permit components to be mounted on the circuit board and below the first conductive ring; and
a heat transport medium, wherein the thermally conductive core further has a top surface disposed across from the base and in close proximity to the upper core surface area, and wherein the heat transport medium is attached to the top surface such that a direction of flow of a cooling medium introduced by the heat transport medium over the first plurality of folded fins enhances heat extraction from the integrated circuit device.

20. The heat dissipation system of claim 19, wherein the integrated circuit device is a microprocessor.

21. A method of forming an enhanced heat dissipation device to extract heat from an integrated circuit device mounted on an assembled printed circuit board comprising:
forming a thermally conductive core having upper and lower core surface areas;
forming a first array of radially extending fins;
forming a first conductive ring from the formed first array, wherein the first conductive ring has a first diameter; and
attaching the first conductive ring to the upper core surface area such that the lower core surface area has sufficient space below the first conductive ring to allow components to encroach around the integrated circuit device when mounted onto the integrated circuit device.

22. The method of claim 21, wherein forming the first array of radially extending fins comprises:
forming a first conductive ribbon;
forming a first alternative series of deep and shallow folds from the first conductive ribbon; and
forming the first conductive ring from the formed first alternative series of deep and shallow folds.

23. A method of forming an enhanced heat dissipation device to extract heat from an integrated circuit device mounted on an assembled printed circuit board comprising:
forming a thermally conductive core having upper and lower core surface areas;
forming a first array of radially extending fins;
forming a first conductive ring from the formed first array, wherein the first conductive ring has a first diameter;
attaching the first conductive ring to the upper core surface area such that the lower core surface area has sufficient space below the first conductive ring to allow components to encroach around the integrated circuit device when mounted onto the integrated circuit device;

forming a second array of radially extending fins;

forming a second conductive ring from the formed second array, wherein the second conductive ring has a second diameter, wherein the second diameter is less than about half the first diameter; and attaching the second conductive ring to the lower core surface area such that the second diameter is of sufficient size to allow the components to encroach around the integrated circuit device and below the first conductive ring.

24. The method of claim 23, wherein forming the second array of radially extending fins comprises:

forming a second conductive ribbon;

forming a second alternative series of deep and shallow folds from the second conductive ribbon; and forming the second conductive ring from the formed second alternative series of deep and shallow folds.

25. The method of claim 24, further comprising:

attaching an integrated circuit device to the thermally conductive core.

26. The method of claim 25, wherein the integrated circuit device comprises a microprocessor.

27. The method of claim 25, wherein the thermally conductive core, the first conductive ring, and the second conductive ring are made of a thermally conductive material.

28. The method of claim 27, wherein the thermally conductive core, the first conductive ring, and the second conductive ring are made of materials selected from the group consisting of aluminum and copper.

* * * * *